(12) United States Patent
Kim et al.

(10) Patent No.: US 10,255,845 B2
(45) Date of Patent: Apr. 9, 2019

(54) GATE DRIVER AND A DISPLAY APPARATUS INCLUDING THE SAME

(71) Applicant: SAMSUNG DISPLAY CO., LTD., Yongin-si, Gyeonggi-Do (KR)

(72) Inventors: Cholho Kim, Suwon-si (KR); Gunwoo Yang, Seoul (KR); Jihoon Yang, Seoul (KR); Yongwoo Lee, Gimpo-si (KR); Hyunyoung Choi, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/447,748

(22) Filed: Mar. 2, 2017

(65) Prior Publication Data

US 2017/0263177 A1    Sep. 14, 2017

(30) Foreign Application Priority Data

Mar. 14, 2016 (KR) .................. 10-2016-0030368

(51) Int. Cl.
*G09G 3/20* (2006.01)

(52) U.S. Cl.
CPC ... *G09G 3/2092* (2013.01); *G09G 2300/0809* (2013.01); *G09G 2310/08* (2013.01); *G09G 2330/021* (2013.01)

(58) Field of Classification Search
None
See application file for complete search history.

(56) References Cited

U.S. PATENT DOCUMENTS

| 2008/0088555 A1* | 4/2008 | Shin | G09G 3/3677 345/87 |
| 2011/0142192 A1* | 6/2011 | Lin | G09G 3/3677 377/77 |
| 2012/0139883 A1* | 6/2012 | Lee | G09G 3/3611 345/204 |

FOREIGN PATENT DOCUMENTS

| KR | 1020090051603 | 5/2009 |
| KR | 1020090081850 | 7/2009 |
| KR | 1020100093732 | 8/2010 |
| KR | 1020150031899 | 3/2015 |
| KR | 1020150069317 | 6/2015 |

* cited by examiner

*Primary Examiner* — Nicholas J Lee
(74) *Attorney, Agent, or Firm* — F. Chau & Associates, LLC

(57) ABSTRACT

An N-th stage of a gate driver includes a first control circuit, a gate signal generating circuit, a carry signal generating circuit, a second control circuit, a third control circuit, and a holding circuit. The first control circuit controls a first signal in response to a first input signal. The gate signal generating circuit generates a gate signal in response to a clock signal and the first signal. The carry signal generating circuit generates a carry signal in response to the clock signal and the first signal. The second control circuit controls the first signal in response to a second input signal. The third control circuit generates a hold control signal in response to a third input signal having a frequency lower than the clock signal's. The holding circuit maintains levels of the first signal, the gate signal, and the carry signal in response to the hold control signal.

6 Claims, 13 Drawing Sheets

GATE DRIVER AND A DISPLAY APPARATUS INCLUDING THE SAME

CROSS-REFERENCE TO RELATED APPLICATION

This application claims priority under 35 USC § 119 to Korean Patent Application No. 10-2016-0030368, filed on Mar. 14, 2016 in the Korean Intellectual Property Office (KIPO), the disclosure of which is incorporated by reference herein in its entirety.

TECHNICAL FIELD

Exemplary embodiments of the inventive concept relate to displaying images, and more particularly, to gate drivers and display apparatuses including the gate drivers.

DISCUSSION OF RELATED ART

Types of flat panel displays (FPD) may include, but are not limited to, a liquid crystal display (LCD), a plasma display panel (PDP), and an organic light emitting display (OLED). LCDs have been widely used in recent years.

A display apparatus, such as an LCD apparatus, includes a display panel in which a plurality of pixels are connected to gate lines and data lines crossing the gate lines which are formed on the display panel. Additionally, the display apparatus includes a gate driver circuit configured to output gate signals to the gate lines and a data driver circuit configured to output data signals to the data lines.

SUMMARY

According to an exemplary embodiment of the inventive concept, a gate driver includes a plurality of stages that are cascade-connected and configured to generate a plurality of gate signals. An N-th stage (where N is a natural number) among the plurality of stages includes a first control circuit, a gate signal generating circuit, a carry signal generating circuit, a second control circuit, a third control circuit, and a holding circuit. The first control circuit controls a first signal at a first node in response to a first input signal. The gate signal generating circuit generates an N-th gate signal among the plurality of gate signals at a second node in response to a clock signal and the first signal. The carry signal generating circuit generates an N-th carry signal among a plurality of carry signals at a third node in response to the clock signal and the first signal. The second control circuit controls the first signal in response to a second input signal. The third control circuit generates a hold control signal at a fourth node in response to a third input signal having a frequency lower than that of the clock signal. The holding circuit maintains a level of the first signal, a level of the N-th gate signal, and a level of the N-th carry signal in response to the hold control signal.

The third control circuit may include a first transistor and a second transistor. The first transistor may have a first electrode connected to the third input signal, a control electrode connected to the third input signal, and a second electrode connected to the fourth node. The second transistor may have a first electrode connected to the fourth node, a control electrode connected to the first node, and a second electrode connected to a first off voltage.

The holding circuit may include a third transistor, a fourth transistor, and a fifth transistor. The third transistor may have a first electrode connected to the second node, a control electrode connected to the fourth node, and a second electrode connected to a second off voltage. The fourth transistor may have a first electrode connected to the first node, a control electrode connected to the fourth node, and a second electrode connected to the first off voltage. The fifth transistor may have a first electrode connected to the third node, a control electrode connected to the fourth node, and a second electrode connected to the first off voltage.

The holding circuit may include a third transistor, a fourth transistor, and a fifth transistor. The third transistor may have a first electrode connected to the second node, a control electrode connected to the fourth node, and a second electrode connected to a second off voltage. The fourth transistor may have a first electrode connected to the first node, a control electrode connected to the fourth node, and a second electrode connected to the third node. The fifth transistor may have a first electrode connected to the third node, a control electrode connected to the fourth node, and a second electrode connected to the first off voltage.

The third control circuit may include a first transistor and a second transistor. The first transistor may have a first electrode connected to the third input signal, a control electrode connected to the third input signal, and a second electrode connected to the fourth node. The second transistor may have a first electrode connected to the fourth node, a control electrode connected to the third node, and a second electrode connected to a first off voltage.

The holding circuit may include a third transistor, a fourth transistor, and a fifth transistor. The third transistor may have a first electrode connected to the second node, a control electrode connected to the fourth node, and a second electrode connected to a second off voltage. The fourth transistor may have a first electrode connected to the first node, a control electrode connected to the fourth node, and a second electrode connected to the first input signal. The fifth transistor may have a first electrode connected to the third node, a control electrode connected to the fourth node, and a second electrode connected to the first off voltage.

The first input signal may be an (N−1)-th carry signal, among the plurality of carry signals, generated from an (N−1)-th stage among the plurality of stages. The second input signal may be an (N+2)-th carry signal, among the plurality of carry signals, generated from an (N+2)-th stage among the plurality of stages.

In a first stage among the plurality of stages, the first input signal may be a vertical start signal and not the (N−1)-th carry signal. In a last stage and a penultimate stage among the plurality of stages, the second input signal may be the vertical start signal and not the (N+2)-th carry signal.

The N-th stage may further include a first pull-down circuit and a second pull-down circuit. The first pull-down circuit may pull down the level of the N-th gate signal in response to the second input signal. The second pull-down circuit may pull down the level of the N-th carry signal in response to the second input signal.

The third control circuit may include a first transistor and a second transistor. The first transistor may have a first electrode connected to the third input signal, a control electrode connected to the third input signal, and a second electrode connected to the fourth node. The second transistor may have a first electrode connected to the fourth node, a control electrode connected to the first node, and a second electrode connected to a first off voltage.

The third control circuit may include a first transistor and a second transistor. The first transistor may have a first electrode connected to the third input signal, a control electrode connected to the third input signal, and a second electrode connected to the fourth node. The second transistor may have a first electrode connected to the fourth node, a control electrode connected to the third node, and a second electrode connected to a first off voltage.

The first input signal may be an (N−1)-th carry signal, among the plurality of carry signals, generated from an (N−1)-th stage among the plurality of stages. The second input signal may be an (N+1)-th carry signal, among the plurality of carry signals, generated from an (N+1)-th stage among the plurality of stages.

According to an exemplary embodiment of the inventive concept, a display apparatus includes a display panel, a data driver, and a gate driver. The display panel includes a plurality of gate lines, a plurality of data lines, and a plurality of pixels connected to the plurality of gate lines and the plurality of data lines. The data driver generates a plurality of data voltages applied to the plurality of data lines. The gate driver generates a plurality of gate signals applied to the plurality of gate lines, and includes a plurality of cascaded stages. An N-th stage (where N is a natural number) among the plurality of stages includes a first control circuit, a gate signal generating circuit, a carry signal generating circuit, a second control circuit, a third control circuit, and a holding circuit. The first control circuit controls a first signal at a first node in response to a first input signal. The gate signal generating circuit generates an N-th gate signal among the plurality of gate signals at a second node in response to a clock signal and the first signal. The carry signal generating circuit generates an N-th carry signal at a third node in response to the clock signal and the first signal. The second control circuit controls the first signal in response to a second input signal. The third control circuit generates a hold control signal at a fourth node in response to a third input signal having a frequency lower than that of the clock signal. The holding circuit maintains a level of the first signal, a level of the N-th gate signal, and a level of the N-th carry signal in response to the hold control signal.

The third control circuit may include a first transistor and a second transistor. The first transistor may have a first electrode connected to the third input signal, a control electrode connected to the third input signal, and a second electrode connected to the fourth node. The second transistor may have a first electrode connected to the fourth node, a control electrode connected to the first node, and a second electrode connected to a first off voltage.

The holding circuit may include a third transistor, a fourth transistor, and a fifth transistor. The third transistor may have a first electrode connected to the second node, a control electrode connected to the fourth node, and a second electrode connected to a second off voltage. The fourth transistor may have a first electrode connected to the first node, a control electrode connected to the fourth node, and a second electrode connected to the first off voltage. The fifth transistor may have a first electrode connected to the third node, a control electrode connected to the fourth node, and a second electrode connected to the first off voltage.

The holding circuit may include a third transistor, a fourth transistor, and a fifth transistor. The third transistor may have a first electrode connected to the second node, a control electrode connected to the fourth node, and a second electrode connected to a second off voltage. The fourth transistor may have a first electrode connected to the first node, a control electrode connected to the fourth node, and a second electrode connected to the third node. The fifth transistor may have a first electrode connected to the third node, a control electrode connected to the fourth node, and a second electrode connected to the first off voltage.

The third control circuit may include a first transistor and a second transistor. The first transistor may have a first electrode connected to the third input signal, a control electrode connected to the third input signal, and a second electrode connected to the fourth node. The second transistor may have a first electrode connected to the fourth node, a control electrode connected to the third node, and a second electrode connected to a first off voltage.

The holding circuit may include a third transistor, a fourth transistor, and a fifth transistor. The third transistor may have a first electrode connected to the second node, a control electrode connected to the fourth node, and a second electrode connected to a second off voltage. The fourth transistor may have a first electrode connected to the first node, a control electrode connected to the fourth node, and a second electrode connected to the first input signal. The fifth transistor may have a first electrode connected to the third node, a control electrode connected to the fourth node, and a second electrode connected to the first off voltage.

The N-th stage may further include a first pull-down circuit and a second pull-down circuit. The first pull-down circuit may pull down the level of the N-th gate signal in response to the second input signal. The second pull-down circuit may pull down the level of the N-th carry signal in response to the second input signal.

The display panel may include a display region in which the plurality of pixels is disposed and a peripheral region surrounding the display region. The gate driver may be integrated in the peripheral region.

According to an exemplary embodiment of the inventive concept, a gate driver includes a plurality of stages that are cascade-connected and configured to generate a plurality of gate signals. An N-th stage (where N is a natural number) among the plurality of stages includes a first control circuit, a gate signal generating circuit, a carry signal generating circuit, a second control circuit, a third control circuit, and a holding circuit. The first control circuit may be configured to control a first signal at a first node in response to a first input signal. The gate signal generating circuit may be configured to generate an N-th gate signal among the plurality of gate signals at a second node in response to a clock signal and the first signal. The carry signal generating circuit may be configured to generate an N-th carry signal at a third node in response to the clock signal and the first signal. The second control circuit may be configured to control the first signal in response to a second input signal. The third control circuit may include a first transistor and a second transistor connected in series. The first transistor may have a first electrode connected to a third input signal, a control electrode connected to the third input signal, and a second electrode connected to a fourth node, and the second transistor may have a first electrode connected to the fourth node, a control electrode connected to the third node, and a second electrode connected to a first off voltage. The holding circuit may include a third transistor and a fourth transistor connected in series. The third transistor may have a first electrode connected to the first node, a control electrode connected to the fourth node, and a second electrode, and the fourth transistor may have a first electrode connected to the second electrode of the third transistor, a control electrode connected to the fourth node, and a second electrode connected to the first input signal.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
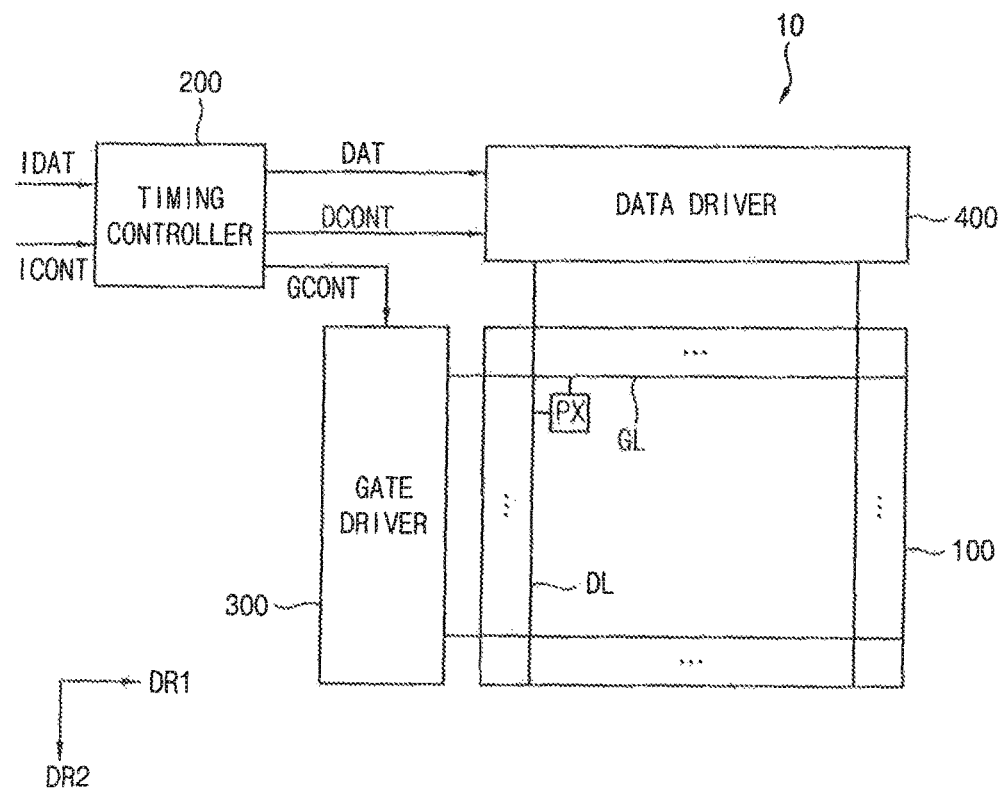
FIG. 1 is a block diagram illustrating a display apparatus according to an exemplary embodiment of the inventive concept.

Exemplary embodiments of the inventive concept will be described more fully hereinafter with reference to the accompanying drawings. Like reference numerals may refer to like elements throughout this application.

Exemplary embodiments of the inventive concept provide a gate driver capable of having a reduced size, increased reliability, and increased performance.

Exemplary embodiments of the inventive concept also provide a display apparatus including the above-mentioned gate driver.

FIG. 1 is a block diagram illustrating a display apparatus according to an exemplary embodiment of the inventive concept.

Referring to FIG. 1, a display apparatus 10 includes a display panel 100, a timing controller 200, a gate driver 300, and a data driver 400.

The display panel 100 operates (e.g., displays an image) using output image data. DAT. The display panel 100 is connected to a plurality of gate lines GL and a plurality of data lines DL. The gate lines GL may extend in a first direction DR1, and the data lines DL may extend in a second direction DR2 crossing (e.g., substantially perpendicular to) the first direction DR1. The display panel 100 may include a plurality of pixels PX that are arranged in a matrix form. Each of the pixels PX may be electrically connected to one of the gate lines GL and one of the data lines DL.

The timing controller 200 controls operations of the display panel 100, the gate driver 300, and the data driver 400. The timing controller 200 receives input image data IDAT and an input control signal ICONT from an external device (e.g., a host or a graphic processor). The input image data IDAT may include a plurality of pixel data for the plurality of pixels PX. The input control signal ICONT may include a master clock signal, a data enable signal, a vertical synchronization signal, a horizontal synchronization signal, etc.

The timing controller 200 generates the output image data DAT using the input image data IDAT. For example, the timing controller 200 may perform an image quality compensation, a spot compensation, an adaptive color correction (ACC), and/or a dynamic capacitance compensation (DCC) on the input image data IDAT to generate the output image data DAT. The timing controller 200 generates a first control signal GCONT using the input control signal ICONT. The first control signal GCONT may be provided to the gate driver 300, and a driving timing of the gate driver 300 may be controlled using the first control signal GCONT. For example, the first control signal GCONT may include a vertical start signal, a gate clock signal, etc. The timing controller 200 also generates a second control signal DCONT using the input control signal ICONT. The second control signal DCONT may be provided to the data driver 400, and a driving timing of the data driver 400 may be controlled using the second control signal DCONT. For example, the second control signal DCONT may include a horizontal start signal, a data clock signal, a polarity control signal, a data load signal, etc.

The gate driver 300 generates a plurality of gate signals for driving the gate lines GL in response to the first control signal GCONT. The gate driver 300 may sequentially provide the gate signals to the gate lines GL.

The data driver 400 generates a plurality of data voltages (e.g., analog voltages) in response to the output image data DAT (e.g., digital data) and the second control signal DCONT. The data driver 400 may sequentially provide the data voltages to the data lines DL.

According to exemplary embodiments of the inventive concept, the gate driver 300 and/or the data driver 400 may be disposed, e.g., directly mounted, on the display panel 100, or may be connected to the display panel 100 as a tape carrier package (TCP) type. Alternatively, the gate driver 300 and/or the data driver 400 may be integrated in the display panel 100.

The display apparatus 10 may further include a printed circuit board (PCB) on which the timing controller 200 is mounted, a flexible PCB (FPCB) on which the data driver 400 is mounted, and/or a voltage generator that generates operating voltages for the gate driver 300. The voltage generator may be referred to as a power management integrated circuit (PMIC).

Figure 2:
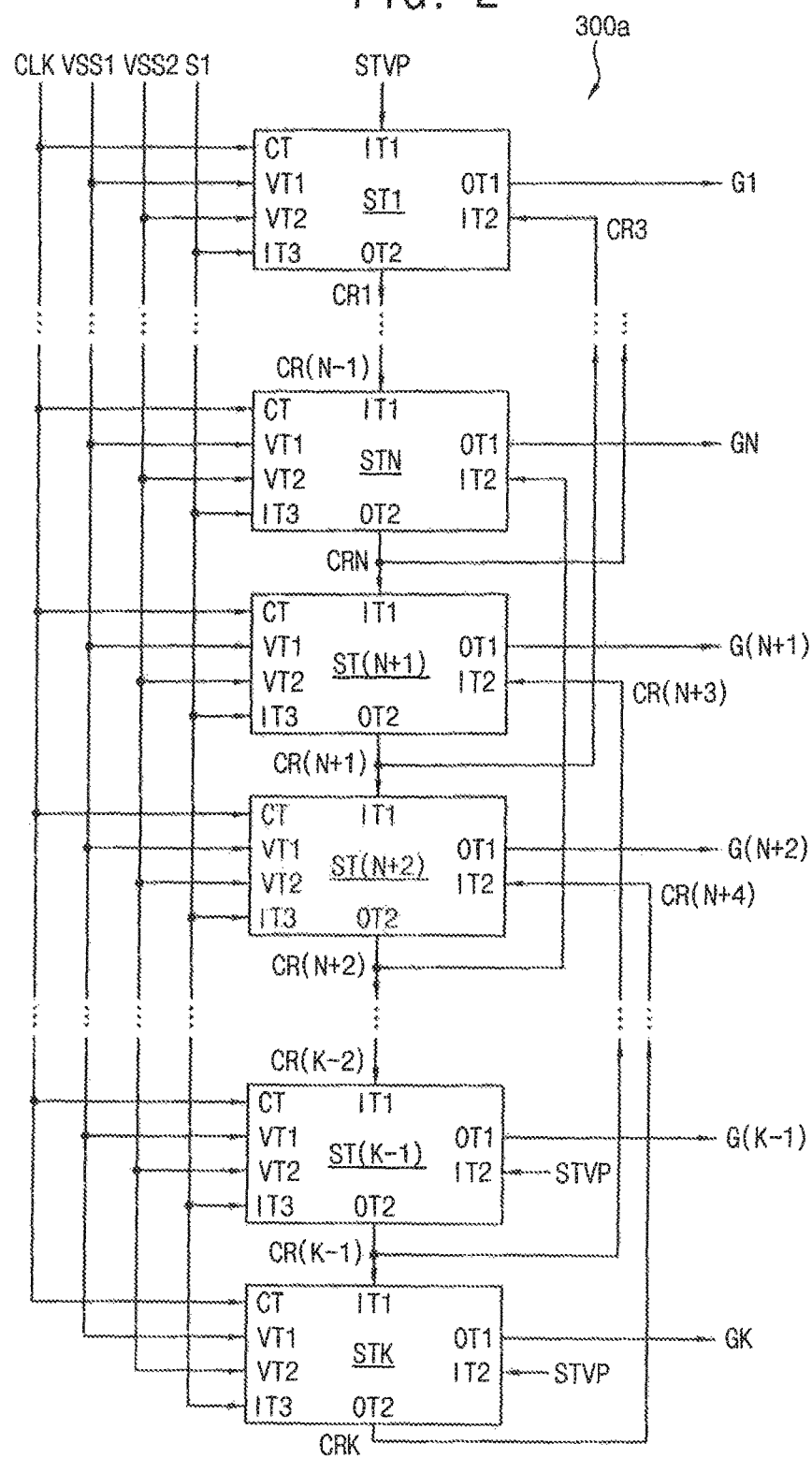
FIG. 2 is a block diagram illustrating a gate driver according to an exemplary embodiment of the inventive concept.

FIG. 2 is a block diagram illustrating a gate driver according to an exemplary embodiment of the inventive concept.

Referring to FIG. 2, a gate driver 300a includes a plurality of stages that are cascade-connected from a first stage to a last stage. For example, the gate driver 300a may include first through K-th stages ST1, . . . , STN, ST(N+1), ST(N+2), . . . , ST(K−1), and STK (where K and N are natural numbers and N is less than K) that are connected one after another to each other. Here, for illustrative purposes, K may be greater than or equal to 6, and N may be greater than 1 and smaller than K by at least 4.

The plurality of stages ST1~STK are connected to the plurality of gate lines GL in FIG. 1, and generates a plurality of gate signals G1, . . . , GN, G(N+1), G(N+2), . . . , G(K−1), and GK and a plurality of carry signals CR1, CR3, . . . , CR(N−1), CRN, CR(N+1), CR(N+2), CR(N+3), CR(N+4), ..., CR(K−2), CR(K−1), and CRK. For example, the N-th stage STN may be connected to an N-th gate line, and may generate the N-th gate signal GN and the N-th carry signal CRN. As will be described with reference to FIGS. 4, 7, and 10, the gate signals G1~GK and the carry signals CR1~CRK may be sequentially activated.

Each of the stages ST1~STK may include a clock terminal CT, a first power supply terminal VT1, a second power supply terminal VT2, a first input terminal IT1, a second input terminal IT2, a third input terminal IT3, a first output terminal OT1, and a second output terminal OT2. The clock terminal CT may receive a clock signal CLK, the first power supply terminal VT1 may receive a first off voltage VSS1, and the second power supply terminal VT2 may receive a second off voltage VSS2. The first input terminal IT1 may receive a first input signal, and the second input terminal IT2 may receive a second input signal. For example, the first input signal may be a carry signal that is generated by one of the stages prior or previous to a present or current stage, and the second input signal may be a carry signal that is generated by one of the stages subsequent to (or next after) the present stage. The third input terminal IT3 may receive a third input signal S1 having a frequency lower than that of the clock signal CLK. The first output terminal OT1 may output a gate signal generated by the present stage, and the second output terminal OT2 may output a carry signal generated by the present stage.

In the present exemplary embodiment of FIG. 2, the first input signal received through the first input terminal IT1 may be a carry signal that is generated from a stage immediately prior or previous to the present stage, and the second input signal received through the second input terminal IT2 may be a carry signal that is generated from a stage after the next stage (e.g., two stages after the present stage). For example, in the N-th stage STN, the first input signal may be the (N−1)-th carry signal CR(N−1) generated from an (N−1)-th stage, and the second input signal may be the (N+2)-th carry signal CR(N+2) generated from the (N+2)-th stage ST(N+2).

According to exemplary embodiments of the inventive concept, in the first stage ST1 for which an immediately previous stage does not exist, the first input signal may be a vertical start signal STVP. In the K-th (last) stage STK and the (K−1)-th (penultimate) stage ST(K−1), for which a stage after the next stage does not exist, the second input signal may be the vertical start signal STVP.

According to an exemplary embodiment of the inventive concept, at least a portion of the stages ST1~STK may receive an inverted clock signal that is an inversion of the clock signal CLK. For example, odd-numbered stages may receive the clock signal CLK, and even-numbered stages may receive the inverted clock signal.

Figure 3:
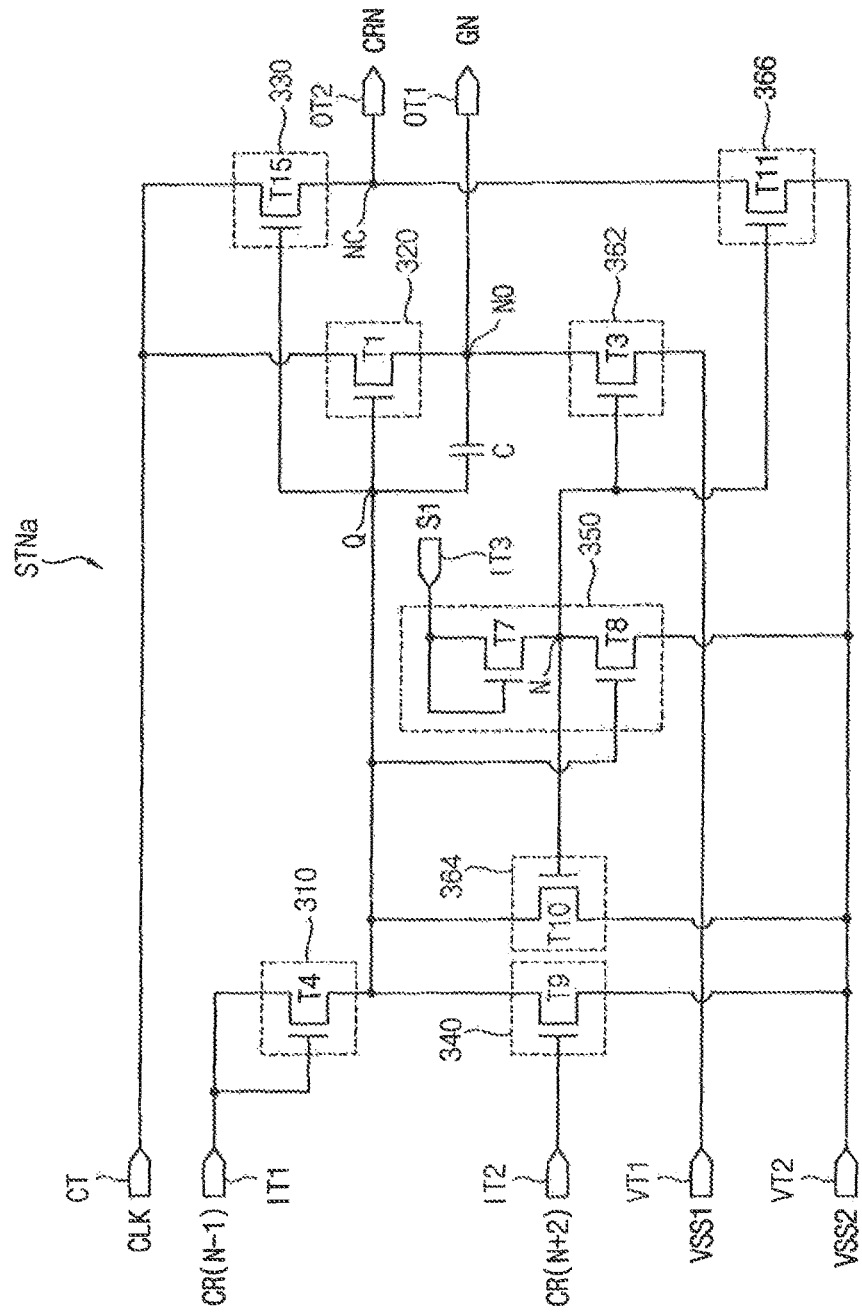
FIG. 3 is a circuit diagram illustrating a stage included in the gate driver of FIG. 2 according to an exemplary embodiment of the inventive concept.

FIG. 3 is a circuit diagram illustrating a stage included in the gate driver of FIG. 2 according to an exemplary embodiment of the inventive concept.

Referring to FIGS. 2 and 3, an N-th stage STNa among the plurality of stages ST1~STK, which are included in the gate driver 300a and cascade-connected, includes a first control circuit 310, a gate signal generating circuit 320, a carry signal generating circuit 330, a second control circuit 340, a third control circuit 350, and first, second, and third holding circuits 362, 364 and 366. Hereinafter, the first, second, and third holding circuits 362, 364, and 366 may be referred to as the holding circuit. The N-th stage STNa may further include a capacitor C.

The first control circuit 310 controls a first signal at a first node Q in response to the first input signal that is received through the first input terminal IT1. As described with reference to FIG. 2, the first input signal may be the (N−1)-th carry signal CR(N−1) that is generated from the (N−1)-th stage ST(N−1) prior to the N-th stage STNa. The first control circuit 310 may include a transistor T4. The transistor T4 may have a first electrode connected to the first input signal CR(N−1), a control electrode connected to the first input signal CR(N−1), and a second electrode connected to the first node Q.

The first control circuit 310 may operate as a diode, and may perform a pull-up operation for the first node Q by providing the first input signal CR(N−1) to the first node Q. The first control circuit 310 may be referred to as a pull-up control circuit.

The gate signal generating circuit 320 generates the N-th gate signal GN at a second node NO in response to the clock signal CLK that is received through the clock terminal CT and the first signal at the first node Q. The N-th gate signal GN may be output through the first output terminal OT1.

The gate signal generating circuit 320 may include a transistor T1. The transistor T1 may have a first electrode connected to the clock signal CLK, a control electrode connected to the first node Q, and a second electrode connected to the second node NO.

The capacitor C may be connected between the first node Q and the second node NO.

The carry signal generating circuit 330 generates the N-th carry signal CRN at a third node NC in response to the clock signal CLK and the first signal at the first node Q. The N-th carry signal CRN may be output through the second output terminal OT2.

The carry signal generating circuit 330 may include a transistor T15. The transistor T15 may have a first electrode connected to the clock signal CLK, a control electrode connected to the first node Q, and a second electrode connected to the third node NC.

In the present exemplary embodiment of FIG. 3, the N-th gate signal GN may be generated using a single transistor (e.g., the transistor T1), and the N-th carry signal CRN may be generated using a single transistor (e.g., the transistor T15). In other words, in the N-th stage STNa of FIG. 3, the gate signal generating circuit 320 may sequentially perform a pull-up operation and a pull-down operation for the second node NO using the transistor T1, and the carry signal generating circuit 330 may sequentially perform a pull-up operation and a pull-down operation for the third node NC using the transistor T15. According to the present exemplary embodiment, a pull-down circuit connected to the second node NO and a pull-down circuit connected to the third node NC may be omitted.

The second control circuit 340 controls the first signal at the first node Q in response to the second input signal that is received through the second input terminal IT2. As described with reference to FIG. 2, the second input signal may be the (N+2)-th carry signal CR(N+2) that is generated from the (N+2)-th stage ST(N+2) subsequent to the N-th stage STNa. The second control circuit 340 may include a transistor T9. The transistor T9 may have a first electrode connected to the first node Q, a control electrode connected to the second input signal CR(N+2), and a second electrode connected to the second off voltage VSS2.

The second control circuit 340 may perform a pull-down operation for the first node Q by providing the second off voltage VSS2 to the first node Q. The second control circuit 340 may be referred to as a pull-down control circuit.

The third control circuit 350 generates a hold control signal at a fourth node N in response to the third input signal S1 that is received through the third input terminal IT3. As described above, the third input signal S1 has a frequency lower than that of the clock signal CLK. For example, the third input signal S1 may be a direct current (DC) signal. Since the third input signal S1 has a frequency lower than that of the clock signal CLK, the hold control signal at the fourth node N may also have a frequency lower than that of the clock signal CLK.

According to exemplary embodiments of the inventive concept, the third control circuit 350 may include two transistors T7 and T8. The transistor T7 may have a first electrode connected to the third input signal S1, a control electrode connected to the third input signal S1, and a second electrode connected to the fourth node N. The transistor T8 may have a first electrode connected to the fourth node N, a control electrode connected to the first node Q, and a second electrode connected to the second off voltage VSS2.

The holding circuit maintains a level of the first signal at the first node Q, a level of the N-th gate signal GN, and a level of the N-th carry signal CRN in response to the hold control signal at the fourth node N. While the holding circuit is enabled (e.g., while the hold control signal maintains an activation level), the level of the first signal at the first node Q may be maintained at a level of the second off voltage VSS2, the level of the N-th gate signal GN may be maintained at the level of the second off voltage VSS2, and the level of the N-th carry signal CRN may be maintained at the level of the second off voltage VSS2.

According to exemplary embodiments of the inventive concept, as described above, the holding circuit may include the first holding circuit 362, the second holding circuit 364 and the third holding circuit 366. The first holding circuit 362 may be connected to the second node NO at which the N-th gate signal GN is generated. The second holding circuit 364 may be connected to the first node Q. The third holding circuit 366 may be connected to the third node NC at which the N-th carry signal CRN is generated.

The first holding circuit 362 may include a transistor T3. The transistor T3 may have a first electrode connected to the second node NO, a control electrode connected to the fourth node N, and a second electrode connected to the first off voltage VSS1. The second holding circuit 364 may include a transistor T10. The transistor T10 may have a first electrode connected to the first node Q, a control electrode connected to the fourth node N, and a second electrode connected to the second off voltage VSS2. The third holding circuit 366 may include a transistor T11. The transistor T11 may have a first electrode connected to the third node NC, a control electrode connected to the fourth node N, and a second electrode connected to the second off voltage VSS2.

According to exemplary embodiments of the inventive concept, as will be described with reference to FIGS. 9, 11, and 12, at least one of the second control circuit 340 and the second holding circuit 364 may include a plurality of transistors (e.g., two or more transistors) that are connected in series.

According to exemplary embodiments of the inventive concept, the transistors T1, T3, T4, T7, T8, T9, T10, T11, and T15 included in the N-th stage STNa may be n-type metal oxide semiconductor (NMOS) transistors. In this example, the first electrode, the control electrode, and the second electrode of each transistor may be a drain electrode, a gate electrode, and a source electrode, respectively.

Figure 4:
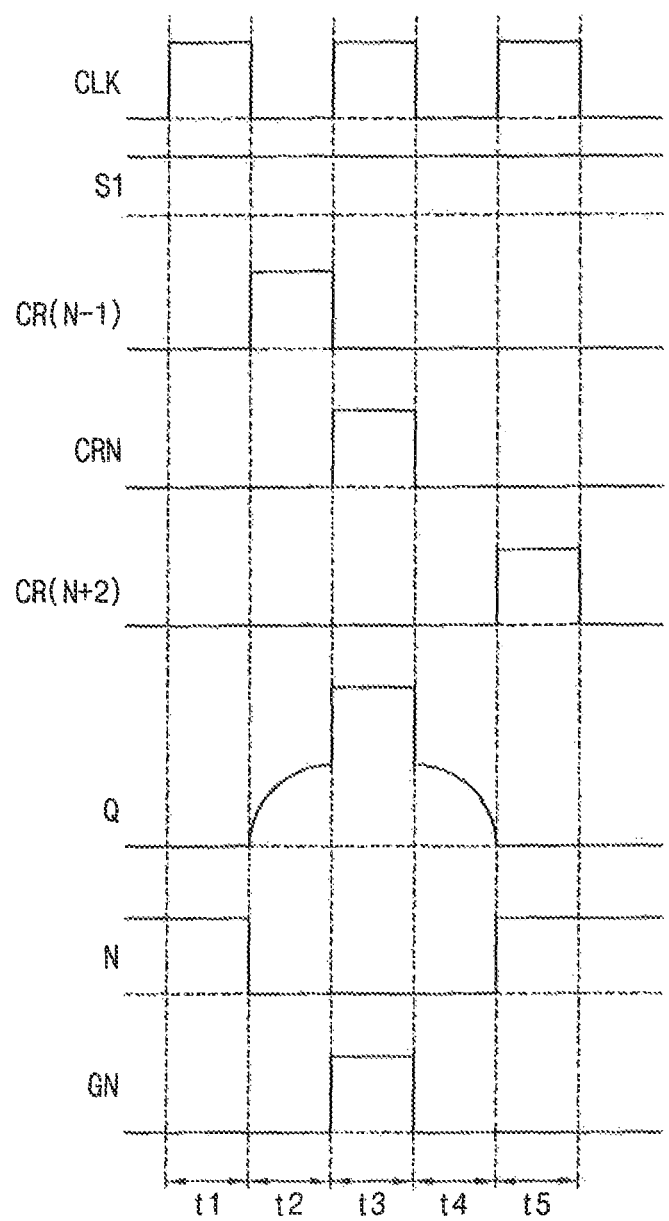
FIG. 4 is a timing diagram for describing an operation of the stage of FIG. 3 according to an exemplary embodiment of the inventive concept.

FIG. 4 is a timing diagram for describing an operation of the stage of FIG. 3 according to an exemplary embodiment of the inventive concept.

Referring to FIGS. 3 and 4, each of durations t1, t2, t3, t4, and t5 may represent one horizontal period. A single horizontal period may correspond to an activation period of one of the gate lines GL (or an activation period of one of the gate signals G1~GK). For example, the durations t1, t2, t3, t4, and t5 may represent an (N−2)-th horizontal period, an (N−1)-th horizontal period, an N-th horizontal period, an (N+1)-th horizontal period, and an (N+2)-th horizontal period, respectively. The clock signal CLK may be toggled for every horizontal period, and a cycle of the clock signal CLK may correspond to two horizontal periods. In the present exemplary embodiment of FIG. 4, the third input signal S1 may be a DC signal having a high level. In other words, a frequency of the third input signal S1 may be about zero.

During the (N−2)-th horizontal period t1, the first input signal CR(N−1) (e.g., the (N−1)-th carry signal) has a low level, and thus, the first signal at the first node Q has a low level. Since the first signal at the first node Q has the low level, the hold control signal at the fourth node N has a high level due to the third input signal S1. The transistors T3, T10, and T11 in the holding circuit maintain an on-state in response to the hold control signal having the high level. An operation during each of first through (N−3)-th horizontal periods, prior to the (N−2)-th horizontal period t1, may be substantially the same as an operation during the (N−2)-th horizontal period t1.

During the (N−1)-th horizontal period t2, since the first input signal CR(N−1) has a high level, the first node Q is pulled up, the capacitor C is charged, and thus, the level of the first signal at the first node Q gradually increases. Since the level of the first signal at the first node Q increases, the hold control signal at the fourth node N has a low level due to the second off voltage VSS2. The transistors T3, T10, and T11 are turned off in response to the hold control signal having the low level.

During the N-th horizontal period t3, the first signal at the first node Q has a high level, the clock signal CLK has a high level, and thus, the N-th gate signal GN and the N-th carry signal CRN are activated and have a high level. In addition, the level of the first signal at the first node Q instantaneously increases because of the activated N-th gate signal GN and the charged capacitor C. The hold control signal at the fourth node N maintains the low level in response to the first signal at the first node Q. The transistors T3, T10, and T11 maintain an off-state in response to the hold control signal having the low level.

During the (N+1)-th horizontal period t4, since the clock signal CLK has a low level, the N-th gate signal GN and the N-th carry signal CRN are deactivated and have a low level, and thus, the level of the first signal at the first node Q instantaneously decreases by an increment amount from the N-th horizontal period t3. In addition, the capacitor C is discharged, and thus, the level of the first signal at the first node Q gradually decreases throughout the (N+1)-th horizontal period t4. Since the first signal at the first node Q still has a high level, the hold control signal at the fourth node N maintains the low level, and the transistors T3, T10, and T11 maintain the off-state. Additionally, during the (N+1)-th horizontal period t4, the (N+1)-th carry signal CR(N+1) is activated and has a high level.

During the (N+2)-th horizontal period t5, since the second input signal CR(N+2) (e.g., the (N+2)-th carry signal) has a high level, the first node Q is pulled down, and thus, the first signal at the first node Q has the low level. Since the first signal at the first node Q has the low level, the hold control signal at the fourth node N has the high level. The transistors T3, T10, and T11 are turned on in response to the hold control signal having the high level. An operation during each of (N+3)-th through K-th horizontal periods subsequent to the (N+2)-th horizontal period t5 may be substantially the same as the operation during the (N−2)-th horizontal period t1.

In the present exemplary embodiment of FIG. 4, the hold control signal that is used to perform an on-off control for the transistors T3, T10, and T11 may have a deactivation (e.g., low) level only during three horizontal periods t2, t3, and t4 and may have an activation (e.g., high) level during horizontal periods other than the three horizontal periods t2, t3, and t4. Thus, the hold control signal may have a relatively low frequency and may be similar to a DC signal. In response to the hold control signal, the transistors T3, T10, and T11 may be turned off during the three horizontal periods t2, t3, and t4, and may be turned on during the horizontal periods other than the three horizontal periods t2, t3, and t4.

In the gate driver (e.g., the gate driver 300a of FIG. 2) according to an exemplary embodiment of the inventive concept, the third control circuit 350 may generate the hold control signal having a relatively low frequency in response to the third input signal S1 having a frequency lower than that of the clock signal CLK. Accordingly, in comparison with a conventional gate driver in which a hold control signal is generated in response to the clock signal CLK, the transistors T3, T10, and T11 included in the holding circuit may have a relatively higher reliability.

In the gate driver (e.g., the gate driver 300a of FIG. 2) according to an exemplary embodiment of the inventive concept, the third control circuit 350 may include a relatively small number of transistors (e.g., two transistors), and thus, a size of the gate driver may be reduced. In addition, since a transistor connected to the clock signal CLK is omitted in the third control circuit 350, delays of the clock signal CLK and the gate signal GN may be reduced, and thus, the gate driver may have a relatively increased performance.

Figure 5:
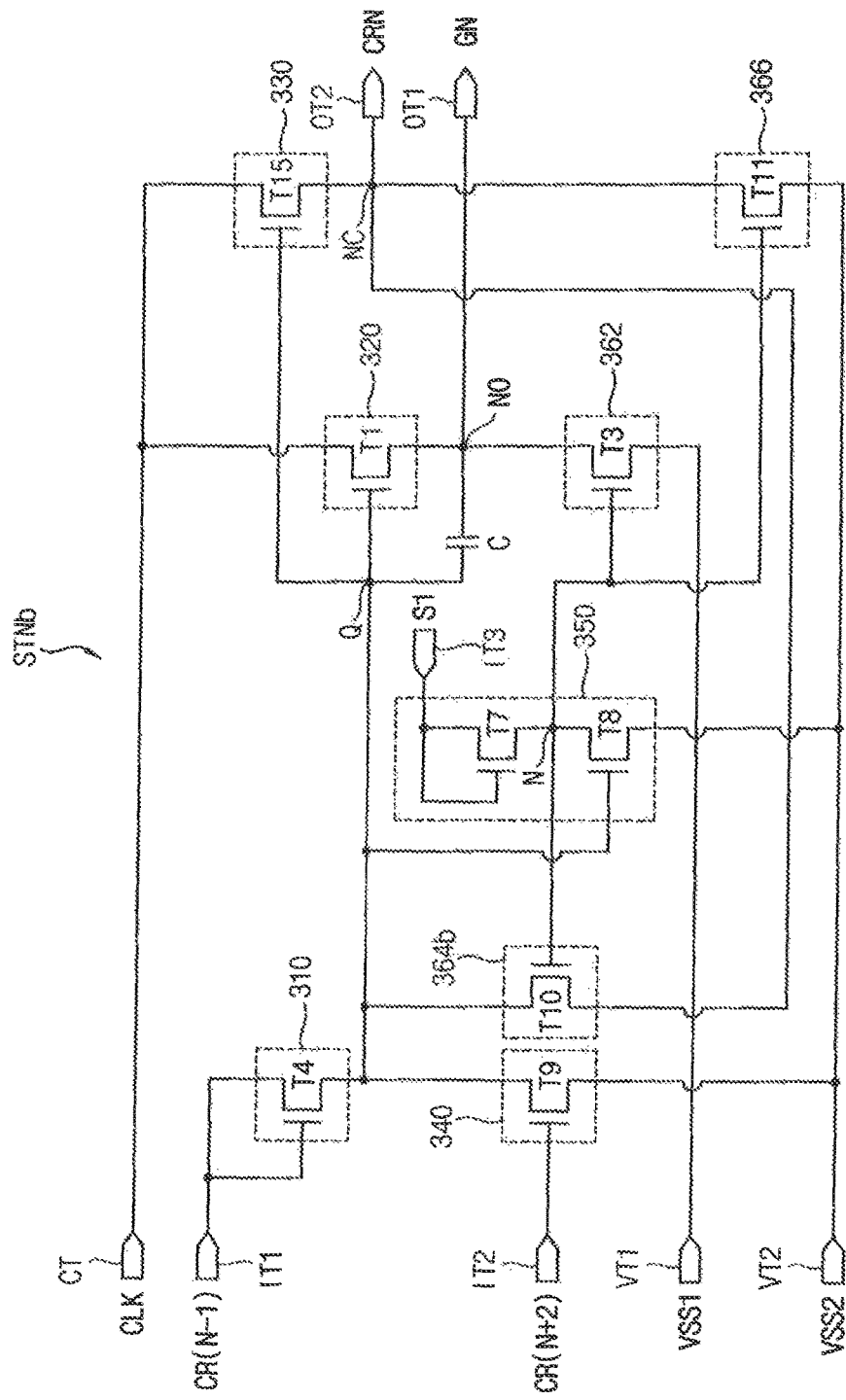
FIGS. 5 and 6 are circuit diagrams illustrating a stage included in the gate driver of FIG. 2 according to exemplary embodiments of the inventive concept.
Figure 6:
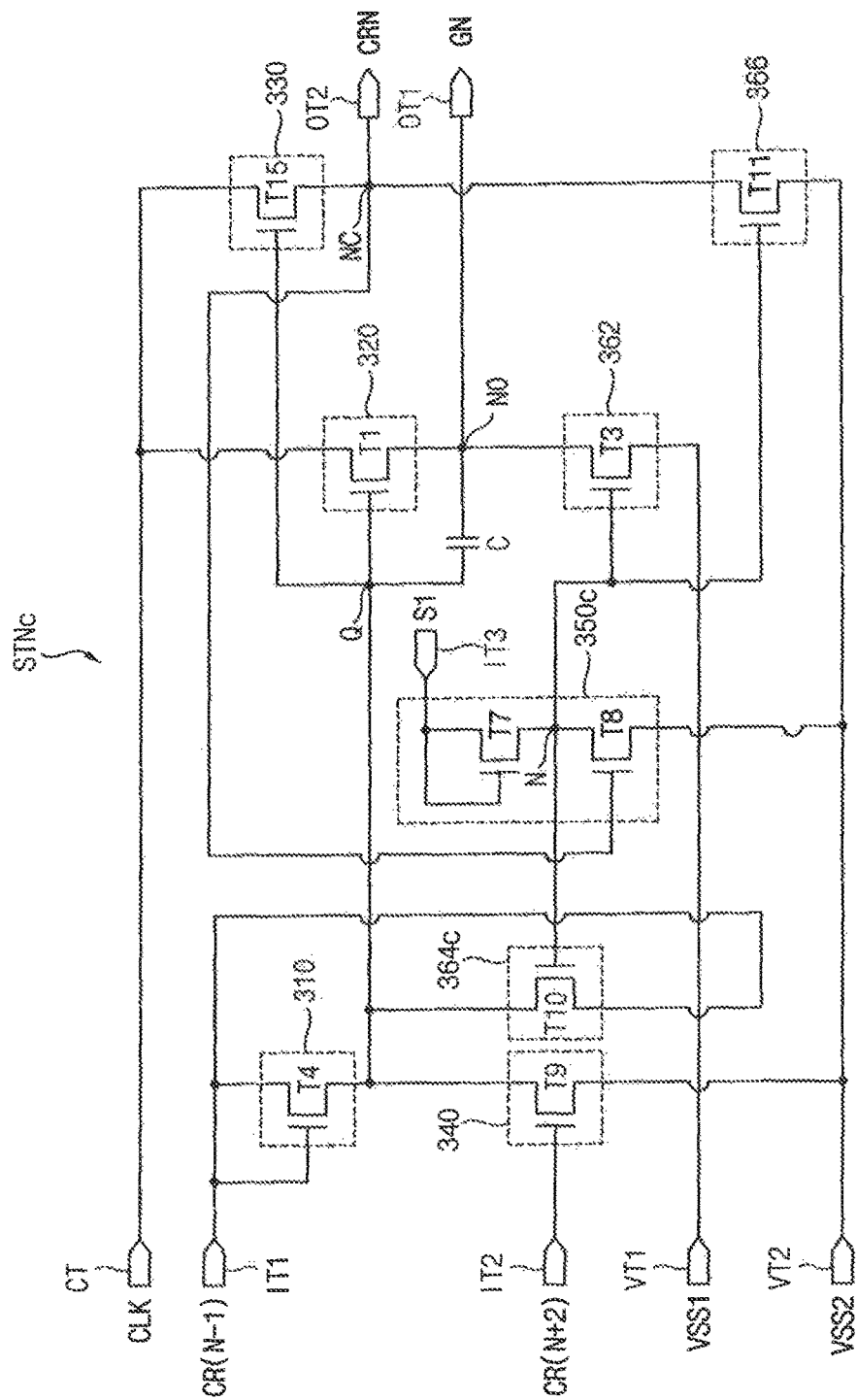

FIGS. 5 and 6 are circuit diagrams illustrating a stage included in the gate driver of FIG. 2 according to exemplary embodiments of the inventive concept.

Referring to FIGS. 2 and 5, an N-th stage STNb among the plurality of stages ST1~STK, which are included in the gate driver 300a and cascade-connected, includes the first control circuit 310, the gate signal generating circuit 320, the carry signal generating circuit 330, the second control circuit 340, the third control circuit 350, the first holding circuit 362, a second holding circuit 364b, and the third holding circuit 366. Hereinafter, the first, second, and third holding circuits 362, 364b, and 366 may be referred to as the holding circuit. The N-th stage STNb may further include the capacitor C.

The N-th stage STNb of FIG. 5 may be substantially the same as the N-th stage STNa of FIG. 3, except for a configuration of the second holding circuit 364b connected to the first node Q.

The second holding circuit 364b may include the transistor T10. The transistor T10 may have a first electrode connected to the first node Q, a control electrode connected to the fourth node N, and a second electrode connected to the third node NC.

An operation of the N-th stage STNb of FIG. 5 may be substantially the same as the operation of the N-th stage STNa of FIG. 3, as described with reference to FIG. 4.

Referring to FIGS. 2 and 6, an N-th stage STNc among the plurality of stages ST1~STK, which are included in the gate driver 300a and cascade-connected, includes the first control circuit 310, the gate signal generating circuit 320, the carry signal generating circuit 330, the second control circuit 340, a third control circuit 350c, the first holding circuit 362, a second holding circuit 364c, and the third holding circuit 366. Hereinafter, the first, second, and third holding circuits 362, 364c, and 366 may be referred to as the holding circuit. The N-th stage STNc may further include the capacitor C.

The N-th stage STNc of FIG. 6 may be substantially the same as the N-th stage STNa of FIG. 3, except for a configuration of the second holding circuit 364c connected to the first node Q and a configuration of the third control circuit 350c.

The third control circuit 350c generates the hold control signal at the fourth node N in response to the third input signal S1 that is received through the third input terminal IT3. The third control circuit 350c may include two transistors T7 and T8. The transistor T7 may have a first electrode connected to the third input signal S1, a control electrode connected to the third input signal S1, and a second electrode connected to the fourth node N. The transistor T8 may have a first electrode connected to the fourth node N, a control electrode connected to the third node NC, and a second electrode connected to the second off voltage VSS2.

The second holding circuit 364c may include the transistor T10. The transistor T10 may have a first electrode connected to the first node Q, a control electrode connected to the fourth node N, and a second electrode connected to the first input signal CR(N−1).

Figure 7:
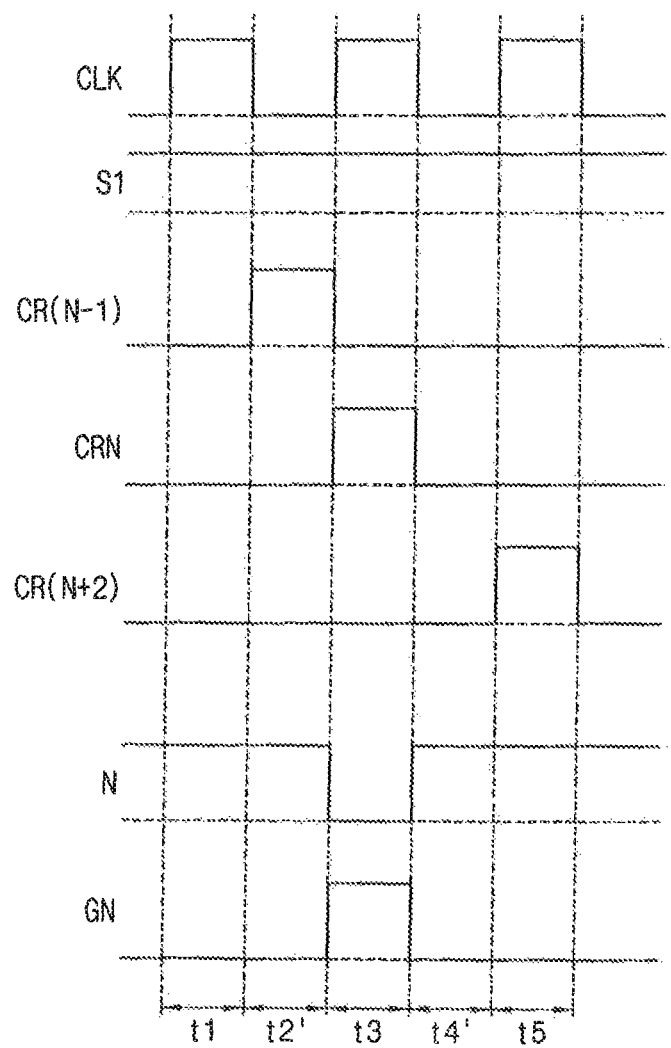
FIG. 7 is a timing diagram for describing an operation of the stage of FIG. 6 according to an exemplary embodiment of the inventive concept.

FIG. 7 is a timing diagram for describing an operation of the stage of FIG. 6 according to an exemplary embodiment of the inventive concept.

Referring to FIGS. 6 and 7, each of durations t1, t2', t3, t4', and t5 may represent one horizontal period. The clock signal CLK may be toggled for every horizontal period. The third input signal S1 may be a DC signal having a high level. Additionally, a waveform of the first signal at the first node Q may be substantially the same as a waveform of the first signal at the first node Q illustrated in FIG. 4.

During the (N−2)-th horizontal period t1, the N-th carry signal CRN at the third node NC has a low level, and thus, the hold control signal at the fourth node N has a high level by the third input signal S1. The transistors T3, T10, and T11 in the holding circuit maintain an on-state in response to the hold control signal having the high level. An operation during each of first through (N−3)-th horizontal periods prior to the (N−2)-th horizontal period t1 may be substantially the same as an operation during the (N−2)-th horizontal period t1.

During the (N−1)-th horizontal period t2', since the N-th carry signal CRN still has the low level, the hold control signal at the fourth node N still has the high level, and the transistors T3 and T11 still maintain the on-state. However, since the first input signal CR(N−1) (e.g., the (N−1)-th carry signal) has a high level, a voltage difference between the control electrode and the second electrode of the transistor T10 becomes very small, and thus, the transistor T10 is turned off. As a result, the first node Q is pulled up, and the capacitor C is charged.

During the N-th horizontal period t3, the first signal at the first node Q has a high level, the clock signal CLK has a high level, and thus, the N-th gate signal GN and the N-th carry signal CRN are activated and have a high level. Since the N-th carry signal CRN has the high level, the hold control signal at the fourth node N has a low level due to the second off voltage VSS2. The transistors T3 and T11 are turned off, and the transistor T10 maintains an off-state, in response to the hold control signal having the low level.

During the (N+1)-th horizontal period t4', since the clock signal CLK has a low level, the N-th gate signal GN and the N-th carry signal CRN are deactivated and have a low level. The N-th carry signal CRN has the low level, and thus, the hold control signal at the fourth node N has the high level. The transistors T3, T10, and T11 are turned on in response to the hold control signal having the high level.

An operation during the (N+2)-th horizontal period t5 and an operation during each of the (N+3)-th through K-th horizontal periods subsequent to the (N+2)-th horizontal period t5 may be substantially the same as the operations described with reference to FIG. 4.

In the present exemplary embodiment of FIG. 7, the hold control signal that is used to perform an on-off control for the transistors T3, T10, and T11 may have the deactivation level during only one horizontal period t3 and may have the activation level during horizontal periods other than the horizontal period t3. Thus, the hold control signal may have a relatively low frequency. In response to the hold control signal, the transistors T3 and T11 may be turned off only during the horizontal period t3, and the transistor T10 may be turned off only during the horizontal periods t2' and t3.

Figure 8:
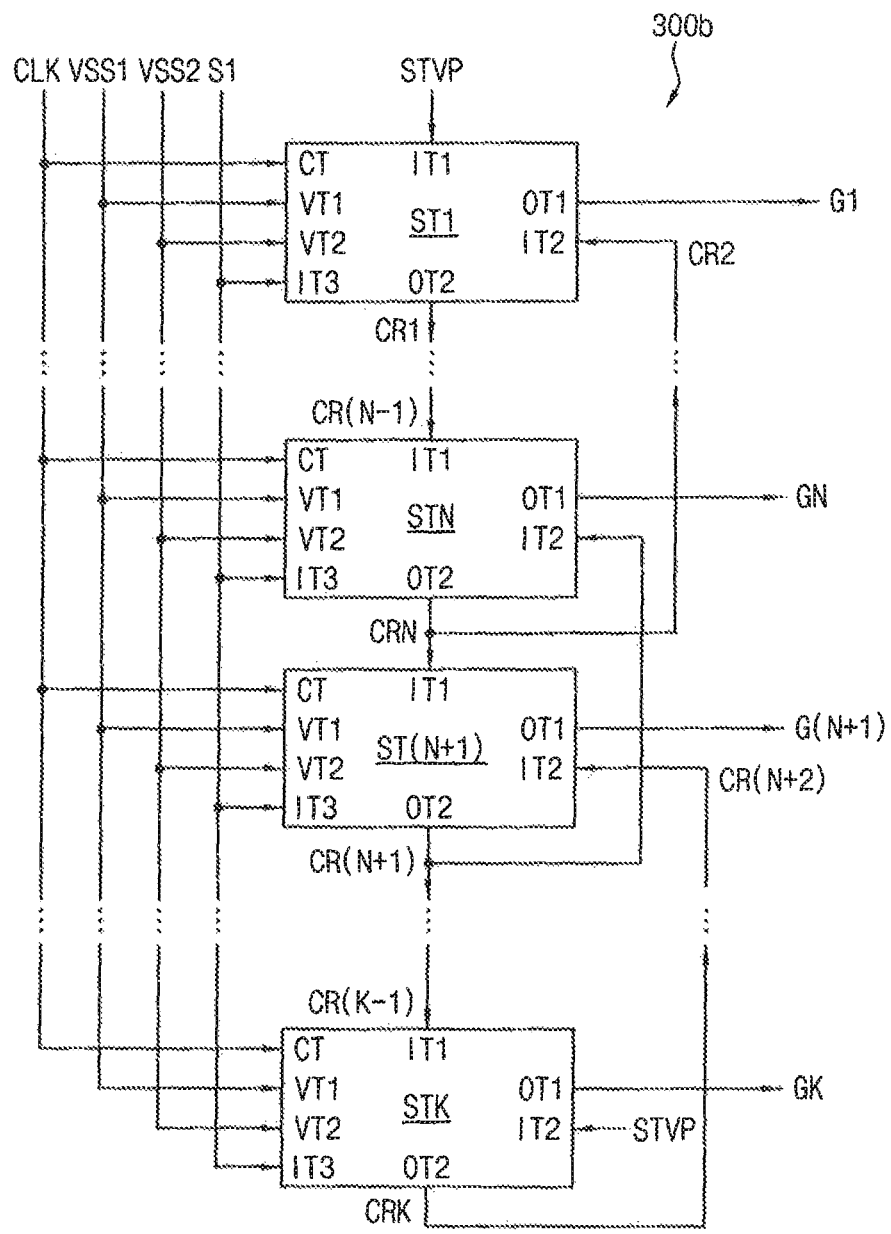
FIG. 8 is a block diagram illustrating a gate driver according to an exemplary embodiment of the inventive concept.

FIG. 8 is a block diagram illustrating a gate driver according to an exemplary embodiment of the inventive concept.

Referring to FIG. 8, a gate driver 300b includes a plurality of stages that are cascade-connected from a first stage to a last stage. For example, the gate driver 300b may include the first through K-th stages ST1, ..., STN, ST(N+1), ..., and STK (where K and N are natural numbers and N is less than K) that are connected one after another to each other. Here, for illustrative purposes, K may be greater than or equal to 4, and N may be greater than 1 and smaller than K by at least 2.

The stages ST1~STK in the gate driver 300b of FIG. 8 may be substantially the same as the stages ST1~STK in the gate driver 300a of FIG. 2, except that the second input signal received through the second input terminal IT2 and a cascade-connection associated with the second input signal are changed.

In the present exemplary embodiment of FIG. 8, the first input signal received through the first input terminal IT1 may be a carry signal that is generated from a stage immediately prior or previous to a present stage, and the second input signal received through the second input terminal IT2 may be a carry signal that is generated from a stage immediately subsequent to or next after the present stage. For example, in the N-th stage STN, the first input signal may be the (N−1)-th carry signal CR(N−1) generated from the (N−1)-th stage ST(N−1), and the second input signal may be the (N+1)-th carry signal CR(N+1) generated from the (N+1)-th stage ST(N+1).

According to exemplary embodiments of the inventive concept, in the first stage ST1 for which an immediately previous stage does not exist, the first input signal may be the vertical start signal STVP, and the second input signal may be the second carry signal CR2. In the last stage (e.g., the K-th stage STK) for which an immediately next stage does not exist, the second input signal may be the vertical start signal STVP.

Figure 9:
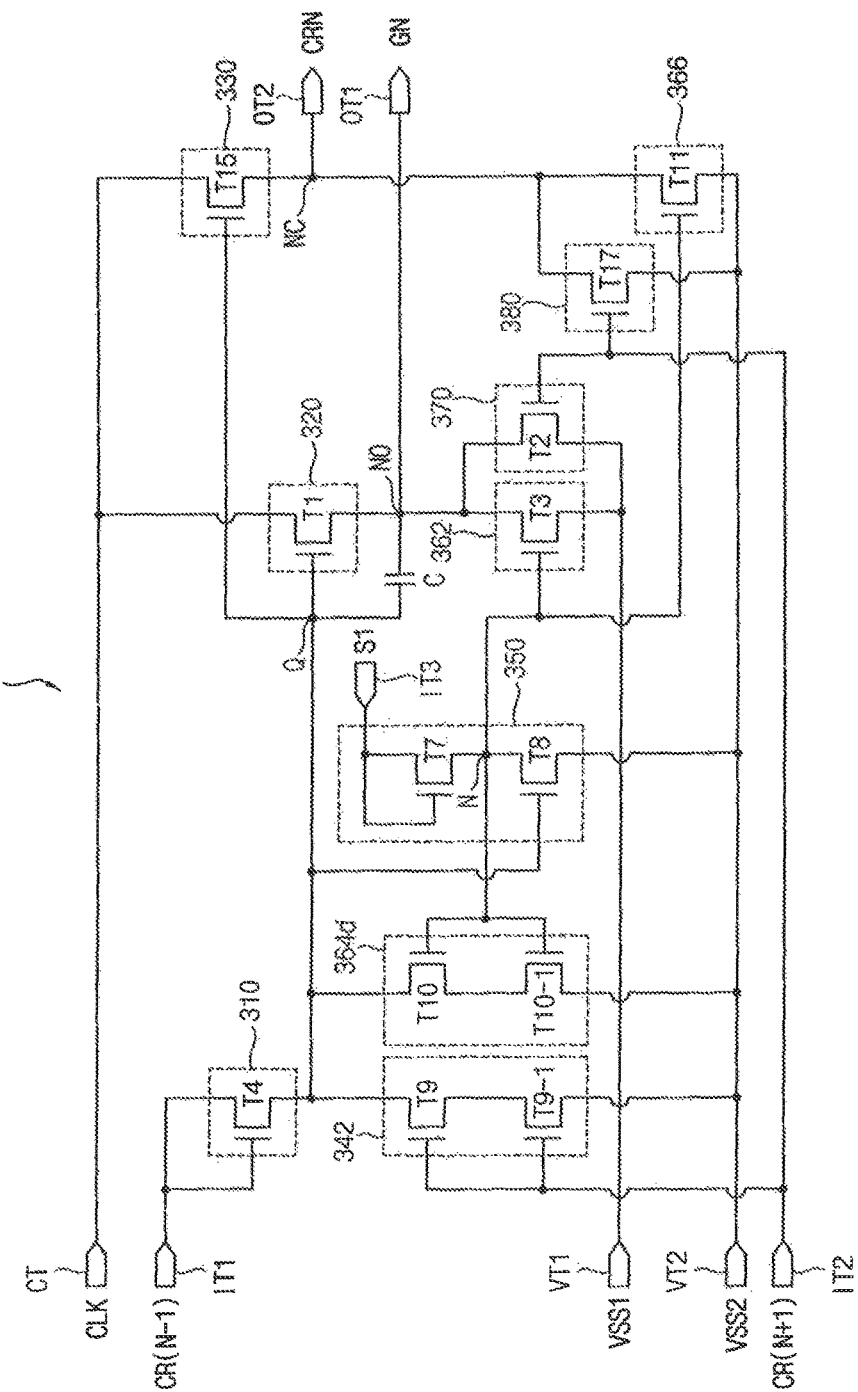
FIG. 9 is a circuit diagram illustrating a stage included in the gate driver of FIG. 8 according to an exemplary embodiment of the inventive concept.

FIG. 9 is a circuit diagram illustrating a stage included in the gate driver of FIG. 8 according to an exemplary embodiment of the inventive concept.

Referring to FIGS. 8 and 9, an N-th stage STNd among the plurality of stages ST1~STK, which are included in the gate driver 300b and cascade-connected, includes the first control circuit 310, the gate signal generating circuit 320, the carry signal generating circuit 330, a second control circuit 342, the third control circuit 350, the first holding circuit 362, a second holding circuit 364d, and the third holding circuit 366. Hereinafter, the first, second, and third holding circuits 362, 364d, and 366 may be referred to as the holding circuit. The N-th stage STNd may further include the capacitor C, a first pull-down circuit 370, and a second pull-down circuit 380.

The N-th stage STNd of FIG. 9 may be substantially the same as the N-th stage STNa of FIG. 3, except that the second input signal CR(N+1) and configurations of the second control circuit 342 and the second holding circuit 364d are changed and the N-th stage STNd of FIG. 9 further includes the first pull-down circuit 370 and the second pull-down circuit 380.

The first pull-down circuit 370 may pull down the level of the N-th gate signal GN in response to the second input signal CR(N+1) that is received through the second input terminal IT2. The first pull-down circuit 370 may include a transistor T2. The transistor T2 may have a first electrode connected to the second node NO, a control electrode connected to the second input signal CR(N+1), and a second electrode connected to the first off voltage VSS1.

The second pull-down circuit 380 may pull down the level of the N-th carry signal CRN in response to the second input signal CR(N+1). The second pull-down circuit 380 may include a transistor T17. The transistor T17 may have a first electrode connected to the third node NC, a control electrode connected to the second input signal CR(N+1), and a second electrode connected to the second off voltage VSS2.

In the present exemplary embodiment of FIG. 9, the N-th gate signal GN may be generated using two transistors T1 and T2, and the N-th carry signal CRN may be generated using two transistors T15 and T17. In other words, in the N-th stage STNd of FIG. 9, the gate signal generating circuit 320 may perform a pull-up operation for the second node NO using a single transistor (e.g., the transistor T1), and the first pull-down circuit 370 may perform a pull-down operation for the second node NO using a single transistor (e.g., the transistor T2). The carry signal generating circuit 330 may perform a pull-up operation for the third node NC using a single transistor (e.g., the transistor T15), and the second pull-down circuit 380 may perform a pull-down operation for the third node NC using a single transistor (e.g., the transistor T17). The gate signal generating circuit 320 may be referred to as a first pull-up circuit, and the carry signal generating circuit 330 may be referred to as a second pull-up circuit.

The second control circuit 342 controls the first signal at the first node Q in response to the second input signal CR(N+1). The second control circuit 342 may include two transistors T9 and T9-1 that are connected in series. The transistor T9 may have a first electrode connected to the first node Q, a control electrode connected to the second input signal CR(N+1), and a second electrode. The transistor T9-1 may have a first electrode connected to the second electrode of the transistor T9, a control electrode connected to the second input signal CR(N+1), and a second electrode connected to the second off voltage VSS2.

The second holding circuit 364d connected to the first node Q may include two transistors T10 and T10-1 that are connected in series. The transistor T10 may have a first electrode connected to the first node Q, a control electrode connected to the fourth node N, and a second electrode. The transistor T10-1 may have a first electrode connected to the second electrode of the transistor T10, a control electrode connected to the fourth node N, and a second electrode connected to the second off voltage VSS2.

As described above, when the second control circuit 342 and/or the second holding circuit 364d includes a plurality of transistors that are connected in series, a potential difference between the first node Q and the second off voltage VSS2 may be divided by the transistors (e.g., T9 and T9−1), and thus, a leakage current at the first node Q may be reduced.

Figure 10:
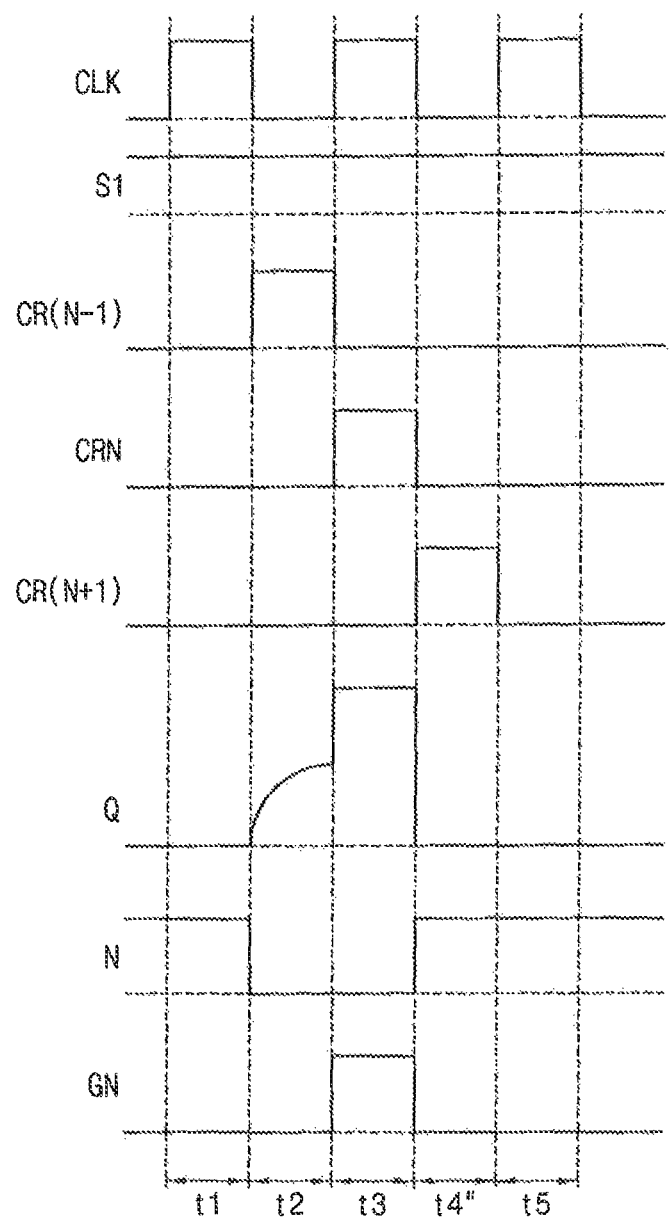
FIG. 10 is a timing diagram for describing an operation of the stage of FIG. 9 according to an exemplary embodiment of the inventive concept.

FIG. 10 is a timing diagram for describing an operation of the stage of FIG. 9 according to an exemplary embodiment of the inventive concept.

Referring to FIGS. 9 and 10, an operation of the N-th stage STNd during each of the (N−2)-th horizontal period t1, the (N−1)-th horizontal period t2, and the N-th horizontal period t3 may be substantially the same as operations described with reference to FIG. 4.

During an (N+1)-th horizontal period t4″, since the second input signal CR(N+1) (e.g., the (N+1)-th carry signal) has a high level, the transistors T2 and T17 in the pull-down circuits 370 and 380 are turned on, and thus, the N-th gate signal GN and the N-th carry signal CRN are deactivated and have a low level. In addition, the transistors T9 and T9−1 in the second control circuit 342 are turned on in response to the second input signal CR(N+1), and the first node Q is pulled down. Thus, the first signal at the first node Q has a low level, the hold control signal at the fourth node N has the high level, and the transistors T3, T10, and T11 are turned on in response to the hold control signal having the high level.

An operation during the (N+2)-th horizontal period t5 and an operation during each of the (N+3)-th through K-th horizontal periods subsequent to the (N+2)-th horizontal period t5 may be substantially the same as the operation during the (N−2)-th horizontal period t1.

In the present exemplary embodiment of FIG. 10, the hold control signal that is used to perform an on-off control for the transistors T3, T10, and T11 may have the deactivation level during only two horizontal periods t2 and t3 and may have the activation level during horizontal periods other than the horizontal periods t2 and t3. Thus, the hold control signal may have a relatively low frequency. In response to the hold control signal, the transistors T3, T10, and T11 may be turned off only during the horizontal periods t2 and t3 and may be turned on during the horizontal periods other than the horizontal periods t2 and t3.

Figure 11:
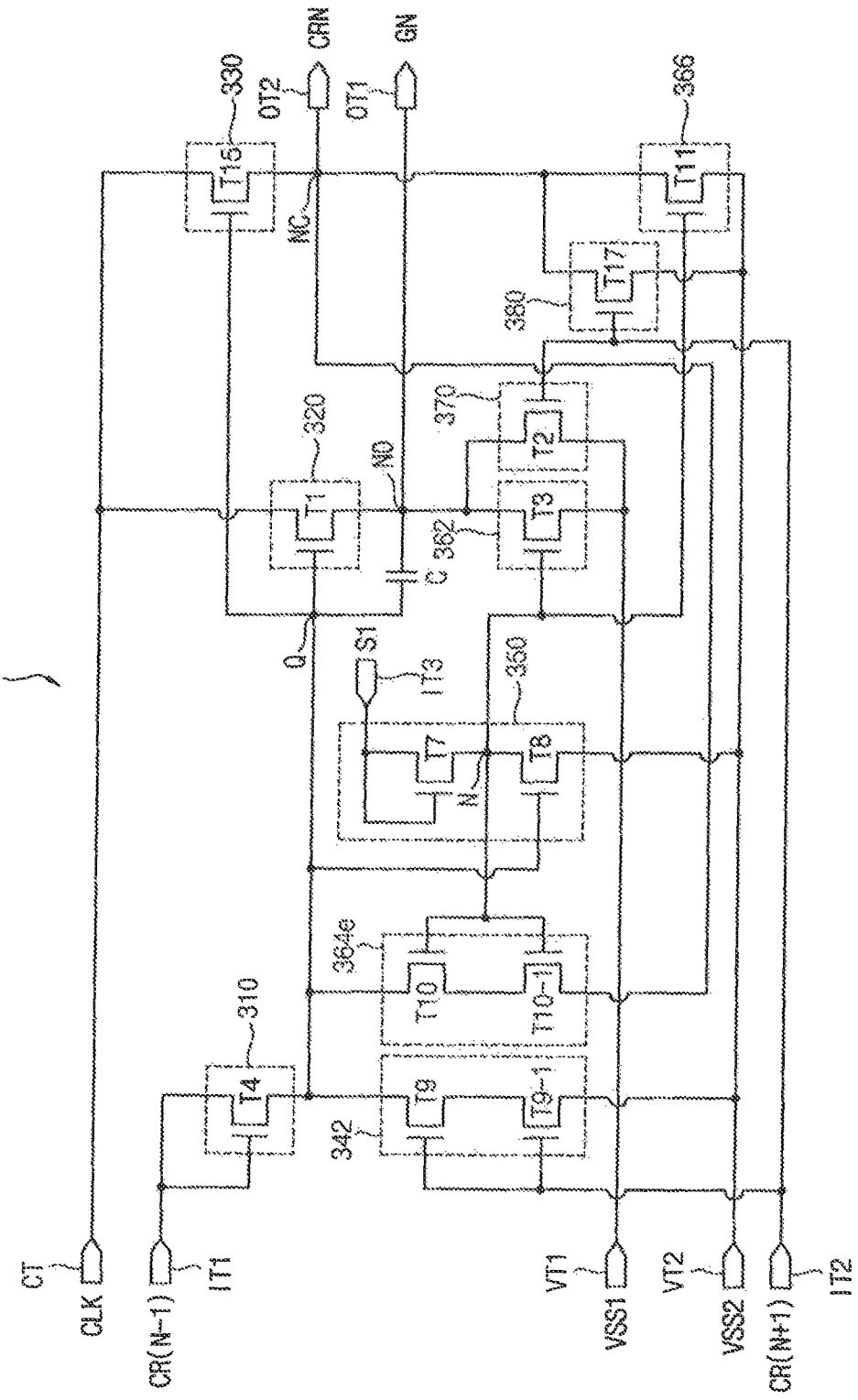
FIGS. 11 and 12 are circuit diagrams illustrating a stage included in the gate driver of FIG. 8 according to exemplary embodiments of the inventive concept.
Figure 12:
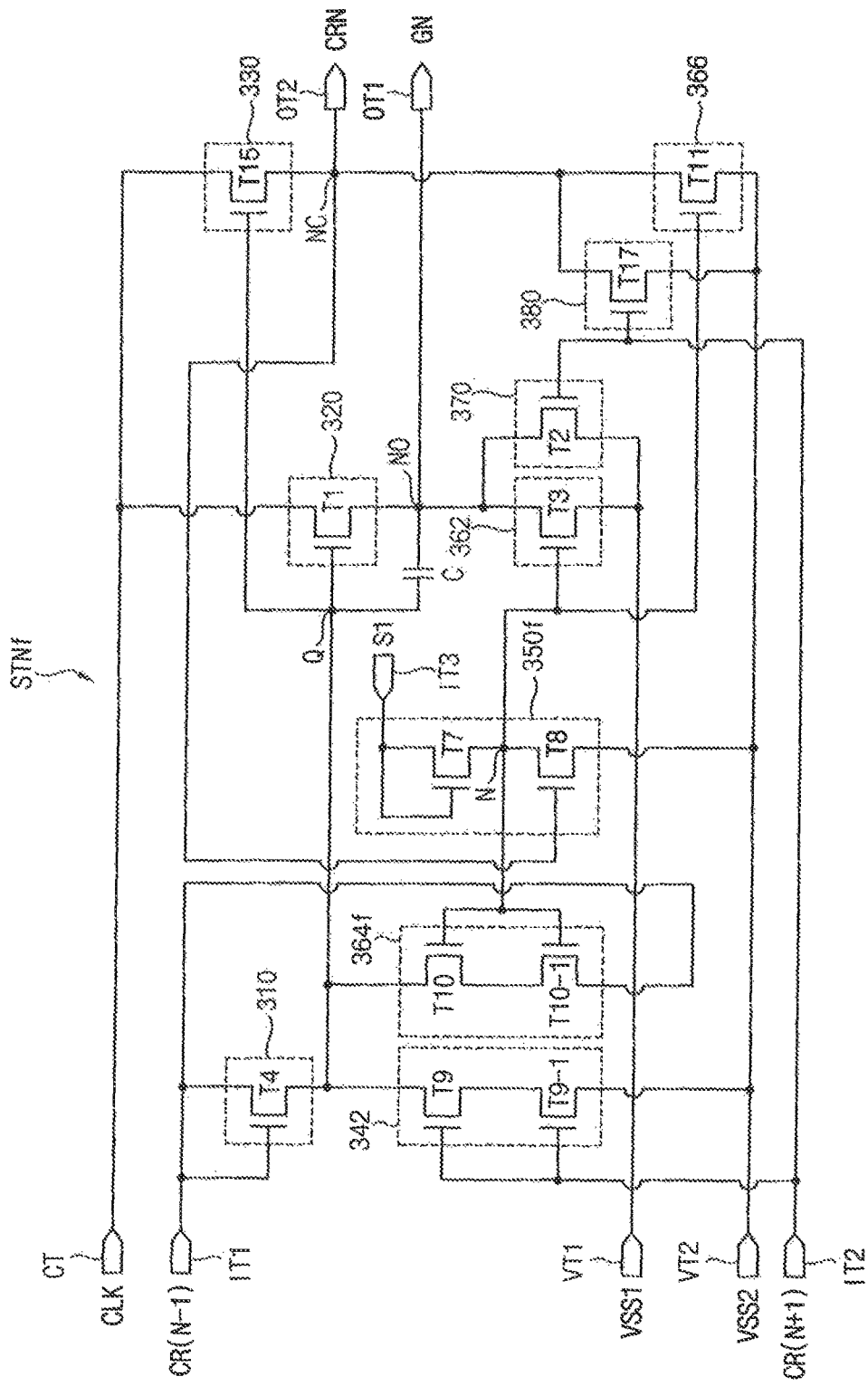

FIGS. 11 and 12 are circuit diagrams illustrating a stage included in the gate driver of FIG. 8 according to exemplary embodiments of the inventive concept.

Referring to FIGS. 8 and 11, an N-th stage STNe among the plurality of stages ST1~STK, which are included in the gate driver 300b and cascade-connected, includes the first control circuit 310, the gate signal generating circuit 320, the carry signal generating circuit 330, the second control circuit 342, the third control circuit 350, the first holding circuit 362, a second holding circuit 364e, and the third holding circuit 366. Hereinafter, the first, second, and third holding circuits 362, 364e, and 366 may be referred to as the holding circuit. The N-th stage STNe may further include the capacitor C, the first pull-down circuit 370, and the second pull-down circuit 380.

The N-th stage STNe of FIG. 11 may be substantially the same as the N-th stage STNd of FIG. 9, except that a configuration of the second holding circuit 364e connected to the first node Q is changed.

The second holding circuit 364e in FIG. 11 may be similar to the second holding circuit 364b in FIG. 5. The second holding circuit 364e may include two transistors T10 and T10−1 that are connected in series. The transistor T10 may have a first electrode connected to the first node Q, a control electrode connected to the fourth node N, and a second electrode. The transistor T10−1 may have a first electrode connected to the second electrode of the transistor T10, a control electrode connected to the fourth node N, and a second electrode connected to the third node NC.

An operation of the N-th stage STNe of FIG. 11 may be substantially the same as the operation of the N-th stage STNd of FIG. 9, as described with reference to FIG. 10.

Referring to FIGS. 8 and 12, an N-th stage STNf among the plurality of stages ST1~STK, which are included in the gate driver 300b and cascade-connected, includes the first control circuit 310, the gate signal generating circuit 320, the carry signal generating circuit 330, the second control circuit 342, a third control circuit 350f, the first holding circuit 362, a second holding circuit 364f, and the third holding circuit 366. Hereinafter, the first, second, and third holding circuits 362, 364f, and 366 may be referred to as the holding circuit. The N-th stage STNf may further include the capacitor C, the first pull-down circuit 370, and the second pull-down circuit 380.

The N-th stage STNf of FIG. 12 may be substantially the same as the N-th stage STNd of FIG. 9, except that a configuration of the second holding circuit 364f connected to the first node Q and a configuration of the third control circuit 350f are changed.

The third control circuit 350f generates the hold control signal at the fourth node N in response to the third input signal S1 that is received through the third input terminal IT3. The third control circuit 350f in FIG. 12 may be substantially the same as the third control circuit 350c in FIG. 6. The third control circuit 350f may include two transistors T7 and T8. The transistor T7 may have a first electrode connected to the third input signal S1, a control electrode connected to the third input signal S1, and a second electrode connected to the fourth node N. The transistor T8 may have a first electrode connected to the fourth node N, a control electrode connected to the third node NC, and a second electrode connected to the second off voltage VSS2.

The second holding circuit 364f in FIG. 12 may be similar to the second holding circuit 364c in FIG. 6. The second holding circuit 364f may include two transistors T10 and T10−1 that are connected in series. The transistor T10 may have a first electrode connected to the first node Q, a control electrode connected to the fourth node N, and a second electrode. The transistor T10−1 may have a first electrode connected to the second electrode of the transistor T10, a control electrode connected to the fourth node N, and a second electrode connected to the first input signal CR(N−1).

An operation of the N-th stage STNf of FIG. 12 may be similar to the operation of the N-th stage STNc of FIG. 6, as described with reference to FIG. 7. In the N-th stage STNf of FIG. 12, a waveform of the first signal at the first node Q may be substantially the same as a waveform of the first signal at the first node Q illustrated in FIG. 10.

Figure 13:
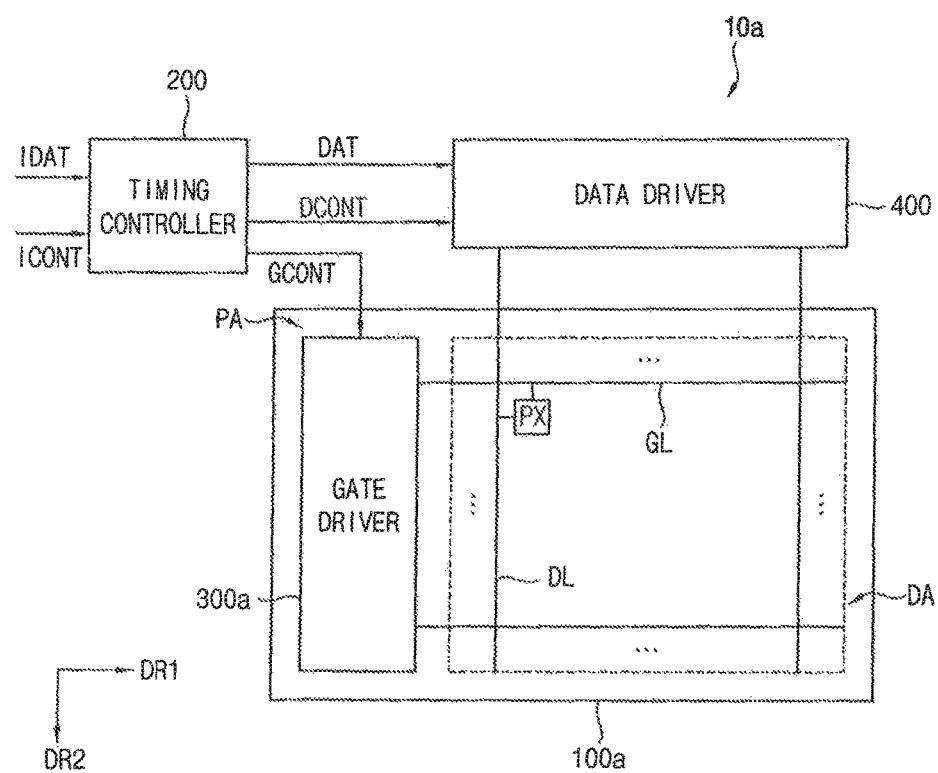
FIG. 13 is a block diagram illustrating a display apparatus according to an exemplary embodiment of the inventive concept.

FIG. 13 is a block diagram illustrating a display apparatus according to an exemplary embodiment of the inventive concept.

Referring to FIG. 13, a display apparatus 10a includes a display panel 100a, the timing controller 200, a gate driver 300a, and the data driver 400.

The display apparatus 10a of FIG. 13 may be substantially the same as the display apparatus 10 of FIG. 1, except that configurations of the display panel 100a and the gate driver 300a are changed.

The display panel 100a may include the display region DA and the peripheral region PA. The display region DA may include the plurality of pixels PX that are arranged in a matrix form. Each of the pixels PX may be electrically connected to one of the gate lines GL and one of the data lines DL. The peripheral region PA may surround the display region DA.

According to exemplary embodiments of the inventive concept, the gate driver 300a may be integrated in the peripheral region PA. For example, the gate driver 300a may be disposed in the peripheral region PA and may be adjacent to a first side (e.g., a relatively short side on the left) of the display panel 100a. The gate driver 300a that is integrated in the display panel 100a may be referred to as an amorphous silicon gate (ASG) circuit.

Although the exemplary embodiments of the inventive concept are described using examples where the gate driver has specific configurations as described with reference to FIGS. 2 and 8 and/or each stage has specific configurations as described with reference to FIGS. 3, 5, 6, 9, 11, and 12, the inventive concept is not limited thereto. For example, each stage in a gate driver may include a control circuit that has a relatively simple structure and generates a hold control signal having a relatively low frequency. A gate driver according to an exemplary embodiment of the inventive concept may generate a hold control signal having any low frequency in response to the third input signal S1 having any low frequency. A plurality of stages in the gate driver, according to an exemplary embodiment of the inventive concept, may be connected to one another such that a present stage receives a carry signal from any previous stage and a carry signal from any next stage. Each stage in the gate driver according to an exemplary embodiment of the inventive concept may include any number of transistors. In addition, the gate driver according to an exemplary embodiment of the inventive concept may operate any driving scheme such as a dual gate clock driving scheme, a quadruple gate clock driving scheme, etc.

The above-described embodiments may be used in any display apparatus and/or any system including a display apparatus, such as a mobile phone, a smart phone, a personal digital assistant (PDA), a portable multimedia player (PMP), a digital camera, a digital television, a set-top box, a music player, a portable game console, a navigation device, a personal computer (PC), a server computer, a workstation, a tablet computer, a laptop computer, etc.

As described above, in the gate driver according to exemplary embodiments of the inventive concept, the control circuit may generate the hold control signal having a relatively low frequency in response to the input signal having a frequency lower than that of the clock signal. Accordingly, the transistors that are included in the holding circuit and operate in response to the hold control signal may have a relatively increased reliability. The control circuit that generates the hold control signal may include a relatively small number of transistors, and thus, a size of the gate driver may be reduced. In addition, delays of the clock signal and the gate signal may be reduced, and thus, the gate driver may have a relatively increased performance.

While the inventive concept has been shown and described with reference to exemplary embodiments thereof, it will be apparent to those of ordinary skill in the art that various substitutions, modifications, and changes may be made thereto without departing from the scope and spirit of the present inventive concept as defined by the following claims.

What is claimed is:

1. A gate driver comprising:
a plurality of stages that are cascade-connected and configured to generate a plurality of gate signals, wherein an N-th stage (where N is a natural number) among the plurality of stages comprises:
a first control circuit configured to control a first signal at a first node in response to a first input signal;
a gate signal generating circuit configured to generate an N-th gate signal among the plurality of gate signals at a second node in response to a clock signal and the first signal;
a carry signal generating circuit configured to generate an N-th carry signal among a plurality of carry signals at a third node in response to the clock signal and the first signal;
a second control circuit configured to control the first signal in response to a second input signal;
a third control circuit configured to generate a hold control signal at a fourth node in response to a third input signal having a frequency lower than that of the clock signal; and
a holding circuit configured to maintain a level of the first signal, a level of the N-th gate signal, and a level of the N-th carry signal in response to the hold control signal,
wherein the first input signal is an (N−1)-th carry signal, among the plurality of carry signals, generated from an (N−1)-th stage among the plurality of stages,
wherein the second input signal is an (N+2)-th carry signal, among the plurality of carry signals, generated from an (N+2)-th stage among the plurality of stages,
wherein, in a first stage among the plurality of stages, the first input signal is a vertical start signal and not the (N−1)-th carry signal, and
wherein, in a last stage and a penultimate stage among the plurality of stages, the second input signal is the vertical start signal and not the (N+2)-th carry signal.

2. The gate driver of claim 1, wherein the third control circuit comprises:
a first transistor having a first electrode connected to the third input signal, a control electrode connected to the third input signal, and a second electrode connected to the fourth node; and
a second transistor having a first electrode connected to the fourth node, a control electrode connected to the first node, and a second electrode connected to a first off voltage.

3. The gate driver of claim 2, wherein the holding circuit comprises:
a third transistor having a first electrode connected to the second node, a control electrode connected to the fourth node, and a second electrode connected to a second off voltage;
a fourth transistor having a first electrode connected to the first node, a control electrode connected to the fourth node, and a second electrode connected to the first off voltage; and
a fifth transistor having a first electrode connected to the third node, a control electrode connected to the fourth node, and a second electrode connected to the first off voltage.

4. A display apparatus comprising:
a display panel including a plurality of gate lines, a plurality of data lines, and a plurality of pixels connected to the plurality of gate lines and the plurality of data lines;
a data driver configured to generate a plurality of data voltages applied to the plurality of data lines; and
a gate driver configured to generate a plurality of gate signals applied to the plurality of gate lines, wherein the gate driver includes a plurality of cascaded stages,
wherein an N-th stage (where N is a natural number) among the plurality of stages comprises:
   a first control circuit configured to control a first signal at a first node in response to a first input signal;
   a gate signal generating circuit configured to generate an N-th gate signal among the plurality of gate signals at a second node in response to a clock signal and the first signal;
   a carry signal generating circuit configured to generate an N-th carry signal among a plurality of carry signals at a third node in response to the clock signal and the first signal;
   a second control circuit configured to control the first signal in response to a second input signal;
   a third control circuit configured to generate a hold control signal at a fourth node in response to a third input signal having a frequency lower than that of the clock signal; and
   a holding circuit configured to maintain a level of the first signal, a level of the N-th gate signal, and a level of the N-th carry signal in response to the hold control signal,
wherein the first input signal is an (N−1)-th carry signal, among the plurality of carry signals, generated from an (N−1)-th stage among the plurality of stages,
wherein the second input signal is an (N+2)-th carry signal, among the plurality of carry signals, generated from an (N+2)-th stage among the plurality of stages,
wherein, in a first stage among the plurality of stages, the first input signal is a vertical start signal and not the (N−1)-th carry signal, and
wherein, in a last stage and a penultimate stage among the plurality of stages, the second input signal is the vertical start signal and not the (N+2)-th carry signal.

5. The display apparatus of claim 4, wherein the third control circuit comprises:
a first transistor having a first electrode connected to the third input signal, a control electrode connected to the third input signal, and a second electrode connected to the fourth node; and
a second transistor having a first electrode connected to the fourth node, a control electrode connected to the first node, and a second electrode connected to a first off voltage.

6. The display apparatus of claim 5, wherein the holding circuit comprises:
a third transistor having a first electrode connected to the second node, a control electrode connected to the fourth node, and a second electrode connected to a second off voltage;
a fourth transistor having a first electrode connected to the first node, a control electrode connected to the fourth node, and a second electrode connected to the first off voltage; and
a fifth transistor having a first electrode connected to the third node, a control electrode connected to the fourth node, and a second electrode connected to the first off voltage.

* * * * *